United States Patent [19]

Okura et al.

[11] 4,227,080
[45] Oct. 7, 1980

[54] DEVICE FOR SHIFTING FROZEN SPECIMEN, FOR USE IN SCANNING TYPE ELECTRON MICROSCOPE

[75] Inventors: Akimitsu Okura, Chiba; Syobu Saito; Motohide Ukiana, both of Ibaraki, all of Japan

[73] Assignee: Hitachi, Ltd., Japan

[21] Appl. No.: 966,040

[22] Filed: Dec. 4, 1978

[30] Foreign Application Priority Data

Dec. 5, 1977 [JP] Japan ............................... 52/144996

[51] Int. Cl.² ........................................... G01M 23/00
[52] U.S. Cl. .................................. 250/311; 250/442; 250/443
[58] Field of Search ................. 250/441, 442, 443, 311

[56] References Cited

U.S. PATENT DOCUMENTS

| 3,679,900 | 7/1972 | Kimura | 250/441 |
| 3,761,709 | 9/1973 | Hasegawa | 250/442 |
| 3,886,358 | 5/1975 | McLaughlin | 250/441 |
| 4,033,904 | 7/1977 | Geriach | 250/442 |

Primary Examiner—Harold A. Dixon
Attorney, Agent, or Firm—Craig & Antonelli

[57] ABSTRACT

A specimen holder holding a frozen specimen is adapted to engage the opened end of a recess in a specimen support, such that the frozen specimen is exposed to the inside of the recess. The mutually engaging specimen holder and the specimen support are shifted to a specimen chamber. In the specimen chamber, the specimen holder is separated from the specimen support and is received by a specimen receiving chamber. The specimen holder received by the specimen receiving member can be moved together with the latter to a specimen treating chamber. Cooling means for cooling the specimen receiving member is unitarily secured to the specimen receiving member, so as to be moved together with the specimen receiving member.

10 Claims, 2 Drawing Figures

DEVICE FOR SHIFTING FROZEN SPECIMEN, FOR USE IN SCANNING TYPE ELECTRON MICROSCOPE

BACKGROUND OF THE INVENTION

1. Field of the Invention

The present invention relates to a device for use in scanning type electron microscope and adapted for shifting frozen specimen.

2. Description of the Prior Art

It is a commonly adopted measure to observe a specimen by a scanning type electron microscope, in a frozen state of the specimen. This method of observation is advantageous because the observation can be made without deterioration and distortion of the specimen. For this reason, the technique for observing frozen specimen is becoming important.

According to a prior art technique, the biological specimen is held by a specimen holder and is immersed, together with the holder, in a refrigerant (liquefied nitrogen) stored in a refrigerant vessel, under atmospheric pressure, so as to be frozen instantaneously. Then, the frozen specimen is covered, and is taken out to the atmosphere together with the specimen holder. The frozen specimen is then shifted to a preparation chamber which communicates, through an air lock valve, with an evacuated specimen chamber, and is placed on a specimen table disposed in the preparation chamber. The preparation chamber is evacuated to a predetermined level of vacuum. Then, the cover is opened by making use of an operation instrument operable from the outside of the preparation chamber and, after opening of the air lock valve, the specimen is shifted, together with the specimen holder and the cover, to a specimen table disposed in the specimen chamber. The electron microscope is operated in this state, for the observation of the specimen.

This prior art technique involves various problems. Namely, it is necessary to provide means for opening the cover in the preparation chamber. This inevitably leads to a complicated construction of the preparation chamber. At the same time, since the shifting of the specimen from one to the other of the preparation chamber and the specimen chamber is made with the cover in the opened state, the shifting is considerably obstructed by the opened cover.

In many cases, it is necessary to effect a certain treatment such as scratching by a knife or an ion spattering on the frozen specimen in the preparation chamber. In order to prevent the specimen from being frozen and deteriorated or distorted during this treatment, it is necessary to provide means for maintaining the specimen table in the preparation chamber at a sufficiently low temperature. At the same time, for preventing the specimen from being molten and deteriorated or distorted during the observation, it is necessary to provide means for cooling the specimen table in the specimen chamber down to an adequate low temperature. Thus, the described prior art technique necessitates two independent cooling means, resulting in a complicated construction around the specimen chamber and increased rate of consumption of the refrigerant for the cooling of the tables.

SUMMARY OF THE INVENTION

It is therefore an object of the invention to provide a device for use in scanning type electron microscope, adapted to shift the frozen specimen, which does not necessitates opening the cover in the preparation chamber nor the means for opening the cover in the preparation chamber.

It is another object of the invention to provide a device for use in scanning type electron microscopes, adapted to shift the frozen specimen, which does not necessitate a cover and which is kept opened when it is shifted together with the frozen specimen from one to the other of the preparation chamber and the specimen chamber.

It is still another object of the invention to provide a device for use in an electron microscope, adapted to shift the frozen specimen, in which the cooling of the specimen during a treatment on the latter and the cooling of the specimen during the observation are performed by a single cooling means.

To these ends, according to the invention, there is provided a device for shifting frozen specimen for use in scanning type electronic microscope comprising: a first, second and a third chambers which are in communication with one another; a specimen unit including a specimen support having a recess, and a specimen holder adapted to hold said frozen specimen and detachably coupled to the opened end of said recess; a specimen receiving member disposed movably between said second and third chambers; and means for making said specimen holder engage said specimen receiving member such that said specimen holder is separated from said specimen support when said specimen unit and said specimen receiving member have been shifted to said second chamber.

These and other objects, as well as advantageous features of the invention will become clear from the following description of the preferred embodiments taken in conunction with the accompanying drawings.

DESCRIPTION OF THE PREFERRED EMBODIMENTS

Figure 1:
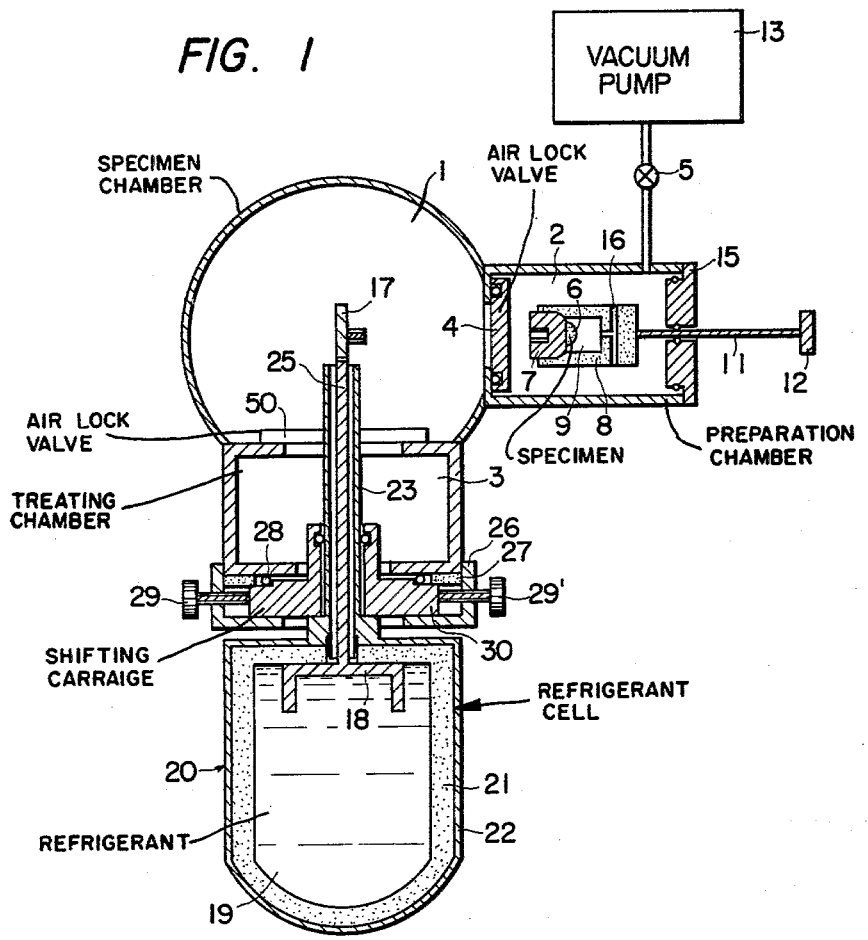
FIG. 1 is a schematic plan view of a device for shifting a frozen specimen for use in an electron microscope, constructed in accordance with a first embodiment of the invention.

Referring first to FIG. 1 showing a preferred embodiment of the invention, a reference numeral 1 denotes a chamber in which a frozen specimen is placed when it is observed through an electron microscope. A vacuum tight preparation chamber 2 is formed at a portion of a wall of the specimen chamber 1, through an air lock valve 4. A cover 15 is detachably secured to a portion of the wall of the preparation chamber 2, in a vacuum tight manner. A vacuum pump for evacuating the preparation chamber 2 is connected to the latter through a valve 5. A specimen shifting shaft 11 extends through the cover 15 in a vacuum tight manner.

A specimen support made of Derlin or the like insulating material is attached to the end of the shaft 11 residing in the preparation chamber 2, while a knob 12 is attached to the other end of the shaft.

The specimen support 8 has a recess 9. A specimen holder 7 for holding the frozen specimen 6 is fitted to the opened end of the recess 9, so as to be exposed to the recess 8. The specimen support 8 has a communication bore 16 through which the recess 9 and the preparation chamber 2 communicate with each other. The specimen holder 7 is threaded at its end opposite to the recess 8.

At the other portion of the wall of the specimen chamber 1, formed is a specimen treating chamber 3, through an air lock valve 50, in a vacuum tight manner. A spacer 27 is attached to the outer wall of the specimen treating chamber 3 opposite to the specimen chamber 1, and a specimen shifting carriage 30 is mounted on a support 26 for free movement in left and right directions, as well as in the direction perpendicular to the drawing. Adjusting screws 29,29' are screwed to the support 26, so as to cramp the specimen shifting carriage 30 therebetween in the right and left direction.

Adjusting screws cramping therebetween the specimen shifting carriage 30 in the direction perpendicular to the drawing are neglected from the drawings.

An "O" ring 28 is disposed between the wall of the specimen treating chamber 3 and the specimen shifting carriage 30, so as to provide a vacuum tight seal therebetween.

A hollow shaft 23 extends through the specimen shifting carriage 30 in a vacuum tight manner, for free axial and rotative movement. To the atmospheric side end of the hollow shaft 23, attached is a refrigerant cell 20. The refrigerant cell 20 consists of a heat insulating vessel 21 for accomodating a refrigerant 19 (e.g. liquefied nitrogen) and a cover for protecting the same. A cooling shaft 25 extends through the hollow shaft 23 into the specimen chamber 1. A specimen receiving member 17 is fixed to the end of the cooling shaft 25. A male screw for engagement with a female screw of the specimen holder 7 is secured to the specimen receiving member 17. The cooling shaft 25 is attached at its other end to a cooling piece 18 which in turn contacts the refrigerant 19. The cooling piece 18 is fixed to the heat insulating vessel 21. Needless to say, the connection between the cooling piece 18, cooling shaft 25 and the heat insulating vessel 21 is made in a vacuum tight manner. A cover for taking the refrigerant into and out of the refrigerant cell 20 is attached to the refrigerant cell 20. This cover is however omitted from the drawings.

In the state as shown in FIG. 1, it is possible to remove the specimen support 8, specimen holder 7 and the specimen 6, together with the cover 15, as the cover 15 is removed from the preparation chamber 2 after the closing of the valve 5, and, further, to remove the specimen holder 7 together with the specimen 6 from the specimen support 8.

Hereinafter, the operation of the device will be described from the step of freezing of the specimen, on an assumption that the above-stated removed specimen is not frozen, for an easier understanding of the invention.

At first, the specimen holder 7 is fitted to the opened end of the recess 9, in such a manner that the specimen 6 is exposed into the recess 9. Then, after moving the cover 15 toward the knob 12, the specimen support 8 is immersed into the previously prepared refrigerant (liquefied nitrogen), while grasping the knob 12 by hand. As a result, the refrigerant flows into the recess 9 through the communication bore 16, so as to freeze the specimen 6 in a moment. After the freezing of the specimen 6, the specimen support 8 is lifted from the refrigerant and, after the removal of the refrigerant from the recess 9, shifted into the preparation chamber 2. Then, the cover 15 is attached to the preparation chamber 2.

It will be seen that the frozen specimen 6 can be shifted to the preparation chamber 2, without allowing a contact of the specimen with ambient air.

Then, the valve 5 is opened and the vacuum pump 13 is started to evacuate the preparation chamber 2 to a predetermined level of vacuum. Subsequently, the air lock valve 4 is opened and the knob is depressed, so that the specimen holder 7 is moved into the specimen chamber 1, together with the specimen support 8. Then, the specimen holder 7 comes to contact the male screw of the specimen receiving member 17. As the knob 12 is further depressed while being rotated, the female screw of the specimen holder 7 and the male screw of the specimen receiving member 17 come into engagement with each other. As the knob 12 is extracted after the complete engagement of the male and female screws, the specimen support 8 is separated from the specimen receiving member 17, although the specimen holder 7 together with the frozen specimen 6 is left on the specimen receiving member 17. A further extraction of the knob 12 returns the specimen support 8 to the preparation chamber 8. The air lock valve 4 is closed in this state.

Then, the refrigerant cell 20 is rotated by 90°, so that the specimen holder 7 and the frozen specimen 6 which are left on the specimen receiving member 17 are also rotated by 90°. The frozen specimen 6 in this condition is ready for the observation through the electron microscope. In this state, since the specimen receiving member 17 is cooled by the refrigerant 19 through the cooling piece 18 and the cooling shaft 25, the frozen specimen 6 received by the specimen receiving member 17 is never molten, so that it is possible to observe the specimen through the electron microscope without the fear of deterioration or distortion of the specimen during the observation.

In case that it is desired to effect some treatments on the specimen received by the specimen receiving member 17, the refrigerant cell 20 is withdrawn and the frozen specimen 6 is shifted to the treating chamber 3. Then, as the air lock valve 50 is closed, it becomes possible to effect any desired treatment on the specimen 6 in the treating chamber 3.

The treatments effected on the specimen are, for example, cutting or scratching of the specimen, vacuum evaporation or ion spattering for imparting conductivity to the surface of the frozen specimen. These treatments are all known and, therefore, are neglected from the drawings.

Usually, the space in the treating chamber 3 is kept under a vacuum. The evacuation of this chamber 3 may be made by making use of the exhaust system for evacuating the chamber 1, or, alternatively, a specific evacuation system may be provided for evacuating the treating chamber 3.

After the completion of the treatment, the air lock valve 50 is opened again, and the refrigerant cell 20 is depressed again to move the frozen specimen 6 into the illustrated position, for the observation through the electron microscope.

After the electron-microscopic observation of the frozen specimen 6, the refrigerant cell 20 is swung back by 90° and, after the opening of the air lock valve 4, the knob is depressed to fit the specimen holder 7, which has been received by the specimen receiving member 17, to the opened end of the recess 9 of the specimen support 8. Then, after rotating tne knob 12 in the reverse direction so as to disengage the male and female screws from each other, the knob 12 is pulled to shift the specimen support 8, specimen holder 7 and the frozen specimen 6 back to the preparation chamber 2. The vacuum in the preparation chamber 2 is broken by closing the air lock valve 4 and removing the cover 15 from the chamber 2, so as to allow the taking out of the frozen specimen 6 together with the specimen holder 7, from the specimen support 8.

It is possible to move slightly the specimen receiving member in the left and right direction, as well as in the back and forth direction in the drawings, by moving slightly in and out the adjusting screws 29,29' and the refrigerant cell 20. At the same time, the position of the specimen receiving member 17 can be finely adjusted in the direction perpendicular to the drawings, by adjusting the two adjusting screws which cramp the specimen receiving member 17 in that direction.

The embodiment as shown in FIG. 1 and heretofore described offers the following advantages:

(1) The frozen specimen is moved from one to the other of the specimen chamber and the preparation chamber, together with the specimen holder and the specimen support, in such a state that it is covered by the holder and support. Therefore, the aforementioned means for opening the cover in the preparation chamber, which is indispensable in the prior art technique, can be eliminated. In addition, the obstruction of the shifting of specimen by the opened cover is avoided.

(2) The cooling of the frozen specimen during the observation through the electron microscope and the cooling of the same during the treatment can be performed advantageously by a single cooling means.

(3) Usually, an electron microscope is provided with a stage for carrying the specimen, in addition to the specimen receiving member. The specimen to be attached to this stage is adapted to be moved to and from the position for the observation through the electron microscope, i.e. to and from the position of the frozen specimen received by the specimen receiving member 17 in the specimen chamber 1 in FIG. 1, by moving the stage in the vertical direction, i.e. in the direction of running of electron for bombarding the specimen to make the latter observable by the electron microscope. This arrangement permits an easy comparative and alternating observation of the frozen specimen attached to the specimen receiving member and the non-frozen specimen attached to the specimen stage. Such an advantage can never be accomplished with the conventional device which requires a repeated replacement of the frozen and non-frozen specimens on a single specimen holder for the comparative observation.

Figure 2:
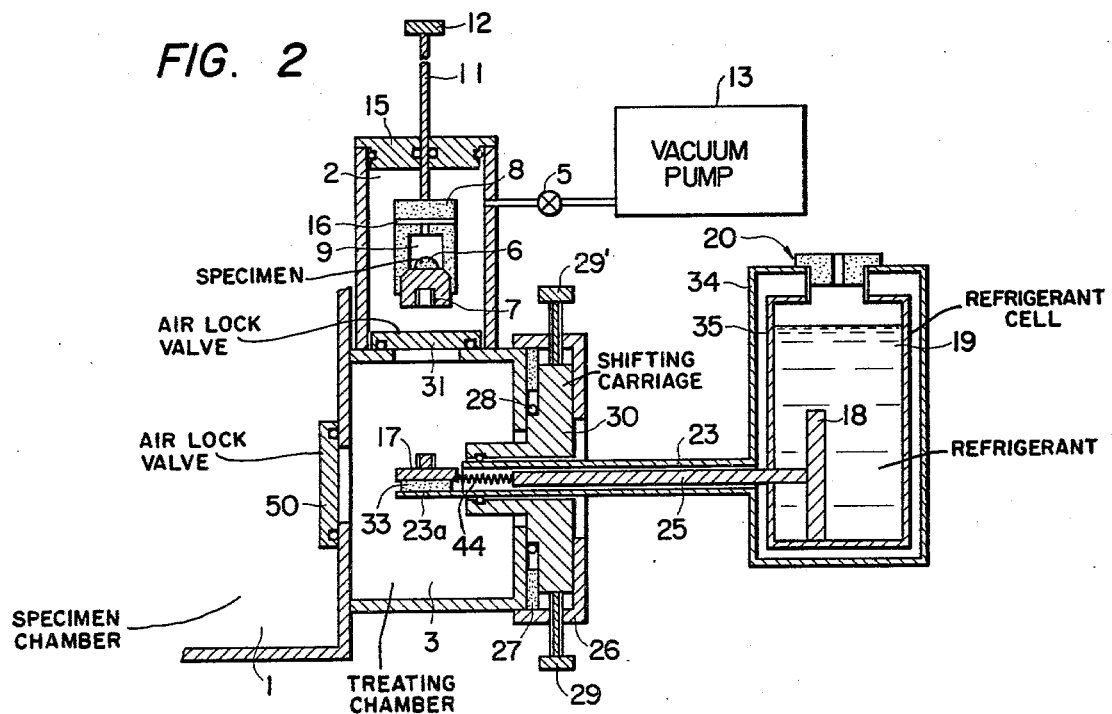
FIG. 2 is a longitudinal sectional view of a device for shifting a frozen specimen for use an electron microscope, constructed in accordance with a second embodiment of the invention.

FIG. 2 shows another embodiment of the invention. In FIG. 2 the same reference numerals are used to denote the same parts or members as those in FIG. 1. One of the major differences between the two embodiments is in that, in the embodiment as shown in FIG. 2, the preparation chamber 2 is attached to a part of a wall of the specimen treating chamber 3 through an air lock valve 31. Therefore, while the embodiment as shown in FIG. 1 allows a direct shifting of the frozen specimen 6 from the preparation chamber 2 into the specimen chamber 1, it is necessary, in the embodiment as shown in FIG. 2, to shift the specimen once into the treating chamber 3 and then to the specimen chamber 1. However, the arrangement of the embodiment as shown in FIG. 2 affords the following advantage. Namely, in the embodiment as shown in FIG. 1, it is necessary to take four steps in order to shift the specimen from the preparation chamber 2 to the specimen chamber 1, when it is necessary to effect a treatment on the frozen specimen 6, i.e. shifting of the specimen receiving member from the treating chamber 3 to the specimen chamber 1, shifting of the frozen specimen 6 in the preparation chamber from the latter to the specimen chamber 1, shifting of the frozen specimen from the specimen chamber to the treating chamber 3 and the shifting of the treated frozen specimen 6 from the treating chamber 3 to the specimen chamber 1. In sharp contrast to the above, according to the arrangement of the embodiment as shown in FIG. 2, the frozen specimen 6 in the preparation chamber 2 to the specimen chamber 1 can advantageously be made in only two steps of shifting of the frozen specimen 6 from the preparation chamber 2 to the treating chamber 3 and the shifting of the treated frozen specimen from the treating chamber 3 to the specimen chamber 1.

Another characteristic of the embodiment as shown in FIG. 2 over that of FIG. 2 resides in that the refrigerant cell 20 consists of an inner and an outer vessels 34, the space between the inner and outer vessels 35,34 being communicated with the vacuum atmosphere of the specimen treating chamber 3 through the gap between the hollow shaft 23 and the cooling shaft 25, and that the specimen receiving member 17 is fixed to the projecting end 23a of the hollow shaft 23, and is connected to the cooling shaft 25 through a flexible heat conductor 44. According to this arrangement, the vibration which may be caused by an abrupt boiling of the refrigerant is conveniently absorbed by the heat conductor 44, and is never transmitted to the specimen receiving member 17. Needless to say, as will be clear to those skilled in the art, all of the advantages derived from the construction as shown in FIG. 1 are brought about also the construction as shown in FIG. 2.

Although the invention has been described through two specific embodiments, these embodiments are only for facilitating the understanding of the invention and are not exclusive nor restricting sense.

What is claimed is:

1. A device for shifting frozen specimen for use in scanning type electron microscope comprising: a first, second and a third chambers which are in mutual communication; a specimen unit including a specimen support having a recess, and a specimen holder adapted to hold a frozen specimen and detachably coupled to the opened end of said recess, said specimen unit being disposed for movement between said first and second chambers; a specimen receiving member disposed for movement between said second and third chambers; and means for making said specimen holder engage said specimen receiving member, such that said specimen holder is separated from said specimen support when said specimen unit and said specimen receiving member have been moved to said second chamber.

2. A device for shifting frozen specimen for use in scanning type electron microscope as claimed in claim 1, characterized by further comprising cooling means for cooling said specimen receiving member, said cooling means being unitarily connected to said specimen receiving member so as to be moved along with said specimen receiving member.

3. A device for shifting frozen specimen for use in scanning type electron microscope as claimed in claim 2, wherein said cooling means includes a shaft extending from inside to outside of said third chamber, said shaft being secured at its inner end to said specimen receiving member, and a refrigerant cell filled with a refrigerant and attached to the outer end of said shaft.

4. A device for shifting frozen specimen for use in scanning type electron microscope as claimed in claim 3, characterized by further comprising a heat conductor disposed between said specimen receiving member and said shaft.

5. A device for shifting frozen specimen for use in scanning type electron microscope as claimed in claim 2, characterized by further comprising a specimen shifting carriage attached to the wall of said third chamber, said specimen receiving member and said cooling means being attached to said specimen shifting carriage.

6. A device for shifting frozen specimen for use in scanning type electron scope as claimed in claim 2 or 3, characterized by further comprising a specimen shifting carriage attached to the wall of said third chamber, said shaft extending through said specimen shifting carriage, so as to be supported by said specimen shifting carriage.

7. A device for shifting frozen specimen for use in a scanning type electron microscope as claimed in claim 1, wherein said first chamber is a preparation chamber, said second chamber is a specimen chamber and said third chamber is a specimen treating chamber.

8. A device for shifting frozen specimen for use in scanning type electron microscope as claimed in claim 1, characterized by further comprising a cooling means for cooling said specimen receiving member, said cooling means being secured unitarily to said specimen received member so as to be moved together with the latter, wherein said first, second and third chambers are a preparation chamber, a specimen chamber and a specimen treating chamber, respectively.

9. A device for shifting frozen specimen for use in scanning type electron microscope as claimed in claim 1, wherein said first, second and third chambers are a preparation chamber, specimen treating chamber and specimen chamber, respectively.

10. A device for shifting frozen specimen for use in scanning type electron microscope as claimed in claim 1, characterized by further comprising means for cooling said specimen receiving member, said means being unitarily secured to said specimen receiving means so as to be shifted together with the latter, wherein said first, second and third chambers are, respectively, a preparation chamber, specimen treating chamber and a specimen chamber.

* * * * *